United States Patent [19]

Mitsutsuka

[11] Patent Number: 4,647,881
[45] Date of Patent: Mar. 3, 1987

[54] SURFACE ACOUSTIC WAVE DEVICE

[75] Inventor: Syuichi Mitsutsuka, Tokyo, Japan

[73] Assignee: Clarion Co., Ltd., Tokyo, Japan

[21] Appl. No.: 795,857

[22] Filed: Nov. 7, 1985

[51] Int. Cl.$^4$ .................. H01P 9/25; H01P 9/145
[52] U.S. Cl. .................. 333/194; 310/313 R; 333/151; 333/153
[58] Field of Search .................. 333/150–155, 333/193–196; 310/313 R, 313 A, 313 B, 313 C, 313 D; 364/821; 357/51, 26

[56] References Cited
FOREIGN PATENT DOCUMENTS
0658716 4/1979 U.S.S.R. .................. 333/150

Primary Examiner—Marvin L. Nussbaum
Attorney, Agent, or Firm—Russell E. Hattis; Stephen R. Arnold

[57] ABSTRACT

A surface acoustic wave device includes a plurality of surface acoustic wave elements provided on a piezoelectric substrate. The device further includes a metal electrode provided on the piezoelectric substrate between and around the respective elements, and a bias voltage is supplied to the metal electrode to cause local attenuation.

3 Claims, 7 Drawing Figures

SURFACE ACOUSTIC WAVE DEVICE

FIELD OF THE INVENTION

This invention relates to a SAW (surface acoustic wave) device including a plurality of SAW elements or including at least one SAW element and a semiconductor IC (integrated circuit) provided on a single substrate, and more particularly to an arrangement for acoustically isolate or separate the SAW elements from each other or to from other electronic circuits.

BACKGROUND OF THE INVENTION

Recent progress in the art of SAW devices provides a complex SAW filter assembly with a number of SAW filters formed on a single substrate and an RF monolithic integrated circuit (IC) assembly with a SAW device and a semiconductor IC placed on a single substrate.

However, no effective proposal has been made to acoustically isolate the respective filters from each other in the complex SAW filter assembly or acoustically separate the SAW device from the semiconductor IC in the RF monolithic IC assembly.

Prior art systems can simply reduce interference between SAW elements or between a SAW device and a semiconductor IC by arranging SAW filters so that SAW propagation paths do not cross with each other, or alternatively by interposing sound absorbing material to attenuate surface acoustic waves as shown in FIG. 5 wherein sound absorbing material 3 is imbedded in a piezoelectric substrate 1 to isolate a SAW device having a pair of comb-shaped electrodes 2 from other similar SAW devices.

The specific placement of SAW elements in the prior art to isolate the SAW propagation paths thereof unduly reduces the number of SAW filters which can be incorporated on a substrate. The use of sound absorbing material requires a high precision to properly place the material in a limited space or to maintain a uniform shape and amount of the material, and therefore causes non-uniformity in finished products.

OBJECT OF THE INVENTION

It is therefore an object of the invention to provide a unique arrangement for a complex SAW filter assembly or an RF monolithic IC assembly which establishes an effective acoustic isolation or separation between SAW filters or between a SAW device and a semiconductor IC.

SUMMARY OF THE INVENTION

The most generic feature of the invention is the use of a metal electrode provided on a substrate of a complex SAW filter assembly or on an RF monolithic IC assembly, which electrode surrounds each SAW elements in the assembly so as to isolate them from each other. Between the electrode and the semiconductor substrate is applied a bias voltage with a value selected to forcibly invert the polarity of the semiconductor surface.

According to a more advantageous feature of the invention, the surface of the semiconductor substrate may be covered by an insulating layer of $SiO_2$ or $Si_3N_4$, for example. Each edge of the metal opposed to the SAW element advantageously defines an irregular margin so as to irregularly reflect an incident surface acoustic wave.

Comb-shaped electrodes in each SAW element are connected to external electrodes or to other electronic circuits on a common substrate by metal strips straddling the metal electrode via the insulating layer.

The portion where the metal electrode is provided has a so-called monolithic MIS (metal/insulator/semiconductor) structure. A surface acoustic wave, when propagating through the monolithic MIS structure, largely changes its propagation loss in response to a bias voltage applied between the metal and the semiconductor. The propagation loss and the bias voltage have relationships shown in FIG. 6 where the temperature is a parameter. FIG. 6 shows that the propagation loss remarkably increases and reaches 100 dB/cm in a limited voltage range. This means that in this voltage range a surface acoustic wave substantially disappears after a short distance propagation.

The voltage range inviting the rapid degradation of a surface acoustic wave corresponds to a voltage value which forcibly inverts the polarity of the surface of the semiconductor (the interface between the piezoelectric layer and the semiconductor). FIG. 7 is a graph showing the result of comparison of the C-V characteristic (capacitance-to-voltage characteristic) at curve b and the propagation loss at curve a. The drawing shows that the propagation loss suddenly increases when the polarity of the semiconductor surface is forcibly inverted (in the left hand range of a dotted line).

As discussed, since a bias voltage of a value forcibly inverting the polarity of the semiconductor surface significantly prevents surface acoustic waves from interfering each other, the invention can prevents acoustic interference between adjacent SAW filters or between a SAW device and a semiconductor IC.

The invention will be better understood from the description given below, referring to some preferred embodiments illustrated in the drawings.

DETAILED DESCRIPTION

Figure 1:
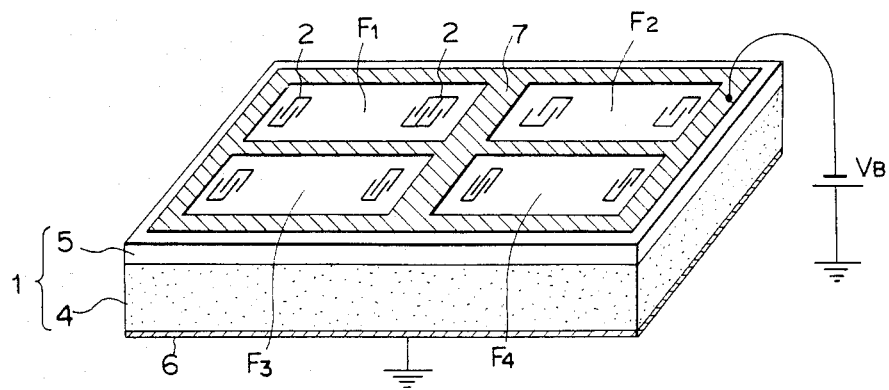
FIG. 1 is a perspective view of a complex SAW filter assembly having an arrangement of the invention.

FIG. 1 shows a complex SAW (surface acoustic wave) filter assembly having an arrangement of the invention. A piezoelectric layer 5 is provided on one surface of a semiconductor substrate 4, and they make a piezoelectric substrate 1. On the other surface of the semiconductor 4 is formed a bottom electrode 6 connected to earth. A plurality of (four in the drawing)

SAW filters $F_1$ through $F_4$ each including two comb-shaped electrodes 2 are provided on an upper surface of the piezoelectric layer 5 opposite to the semiconductor 4. The respective filters $F_1$ to $F_4$ are surrounded and isolated by a metal electrode 7. A bias voltage $V_B$ is applied between the metal 7 and the bottom electrode 6.

Figure 2:
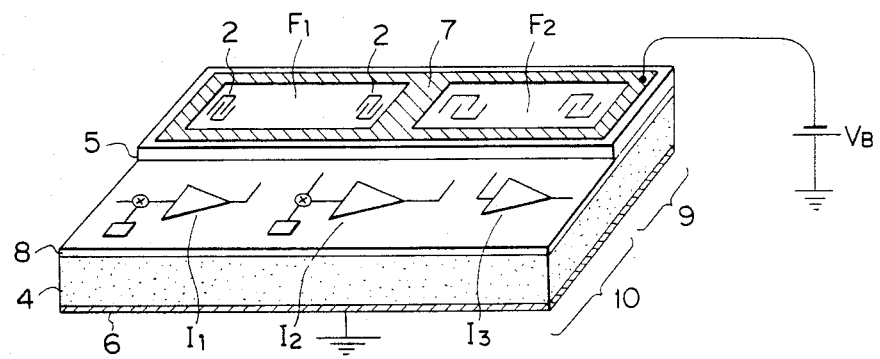
FIG. 2 is a perspective view of an RF monolithic IC having an arrangement of SAW elements according to the invention.

FIG. 2 shows an RF monolithic IC (integrated circuit) assembly having an arrangement according to the invention. A semiconductor substrate 4 is provided on one surface thereof with an insulating layer 8 on which a piezoelectric layer 5 is selectively provided. The portion including the piezoelectric layer 5 is a SAW device segment 9 whereas the portion with the insulator 8 exposed is a semiconductor IC segment 10. The SAW device segment 9 includes a plurality of SAW elements each having two bomb-shaped electrodes 2. The individual SAW elements are surrounded and isolated by a metal electrode 7. A bias voltage is applied between the metal 7 and a bottom electrode 6 provided on the bottom surface of the semiconductor 4 and connected to earth. The semiconductor IC segment 10 includes different electronic circuits $I_1$ through $I_3$.

Figure 3:
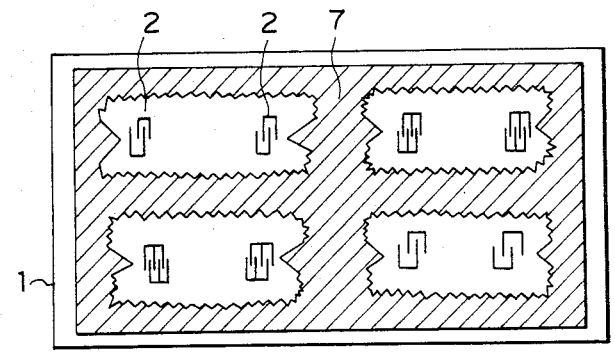
FIG. 3 is a plan view of a complex SAW filter assembly having a more specific arrangement of the invention.

In the assemblies of FIG. 1 and FIG. 2, the metal 7 may be made of the same material as that of the comb-shaped electrodes 2 or electrodes of the semiconductor IC's. Also, the metal 7 may be formed at the same time and by the same method (etching) as the comb-shaped electrodes 2 and semiconductor IC electrodes are made. Each edge of the metal 7 opposed to the filter need not be straight as shown in FIGS. 1 and 2 but may define an irregular margine with the filter as shown in FIG. 3 to decrease the effect of reflection of a surface acoustic wave by the edge.

Figure 4:
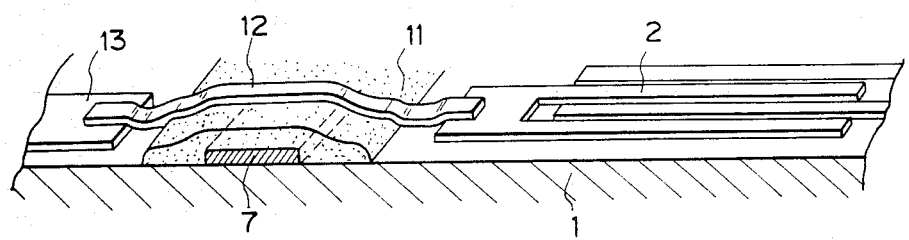
FIG. 4 is a fragmentary perspective view of the assembly of FIG. 1 or FIG. 2 which shows how to connect a comb-shaped electrode to an external electrode or to a semiconductor IC.
Figure 5:
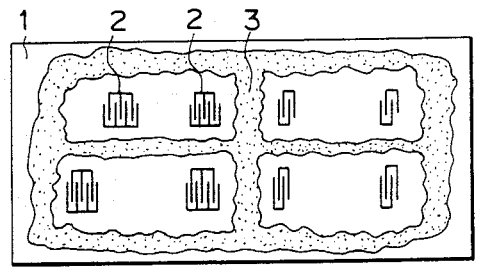
FIG. 5 is a plan view of a prior art arrangement of a SAW device.
Figure 6:
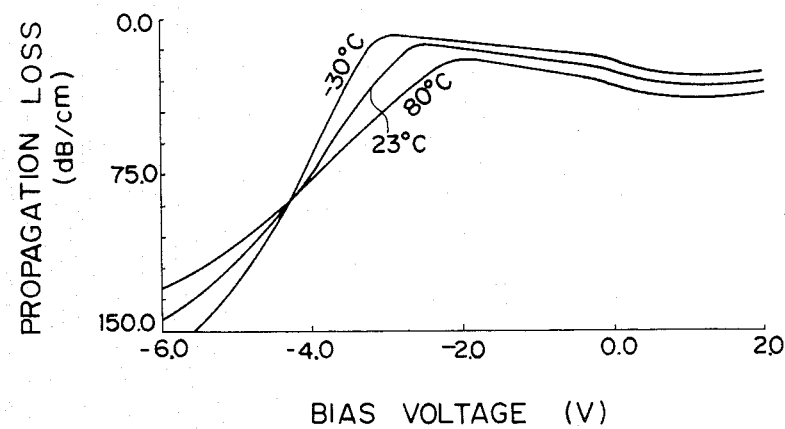
FIG. 6 is a graph showing the relationship between the propagation loss and a bias voltage.
Figure 7:
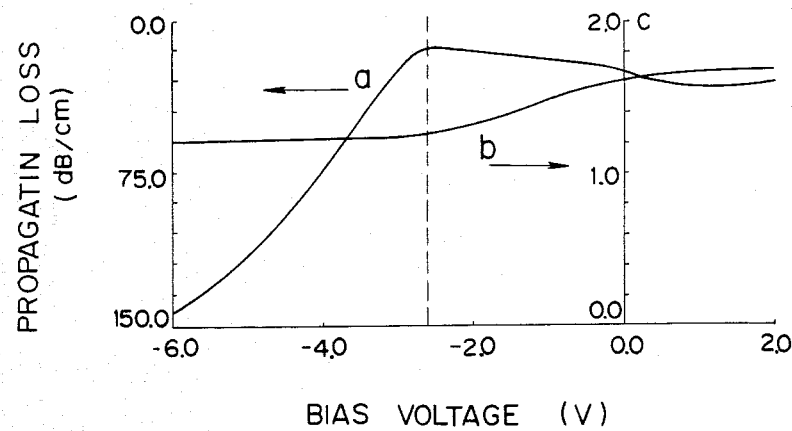
FIG. 7 is a graph showing the relationship between the propagation loss and the capacitance-to-voltage characteristic (high frequency capacitance to bias voltage).

The use of the metal 7 requires a specific arrangement for connecting the comb-shaped electrodes 2 to external electrodes or to electrodes of the semiconductor IC's, although a conventional wire bonding may be employed. The invention specifically proposes a multi-layer wiring as shown in FIG. 4 wherein an insulating layer 11 is provided on the metal 7, and a wiring metal 12 is provided on the insulator 11 to electrically connect the comb-shaped electrode 2 to an external electrode or to an electrode 13 of a semiconductor IC.

The arrangement of the invention may be used not only in the SAW filter assembly or RF monolithic IC assembly as illustrated but also in a delay line oscillator, convolver or SAW change transfer device.

As described, since the invention uses the metal electrode which can be formed in the same process and step as the comb-shaped electrodes are formed, it maintains uniform configuration and position of the metal electrode and hence maintains a uniform property of finished products as compared to the prior art arrangement using the sound absorbing material. In comparison with another prior art arrangement which reserves a great distance between individual SAW elements to isolate the SAW propagation paths thereof, while the prior art imposes a limitation in the number of elements provided in a given area of a substrate, the invention arrangement can incorporate more elements in a substrate with the same area.

The embodiments of the invention is which an exclusive property or privilege is claimed are defined as follows.

1. A surface acoustic wave device comprising:
   a piezoelectric substrate disposed on a semiconducting layer;
   a plurality of acoustically coupled acoustic wave transducers provided on said substrate;
   at least one metal electrode disposed on regions of said substrate where substantial surface acoustic wave attenuation is desired; and
   a bias voltage applying means for applying a bias voltage to said metal electrode sufficient to invert the polarity of the surface of said semiconductor layer confronting said electrode, said semiconductor layer producing said attenuation when the polarity of the surface thereof confronting said electrode is inverted with respect to the remainder of said semiconductor layer.

2. A surface acoustic wave device comprising:
   a semiconductor substrate;
   an insulating substrate provided on said semiconductor substrate;
   a piezoelectric layer selectively provided on said insulating layer;
   a plurality of acoustically coupled surface acoustic wave transducers provided on said piezoelectric layer;
   at least one semiconductor circuit provided on said insulating layer not covered by said piezoelectric layer;
   a metal electrode disposed upon said piezoelectric layer and surrounding at least one of said surface acoustic wave transducers; and
   a bias voltage applying means for applying a bias voltage to said metal electrode sufficient to invert the polarity of the surface of said semiconductor substrate confronting said electrode, said semiconductor substrate producing said attenuation when the polarity of the surface thereof confronting said electrode is inverted with respect to the remainder of said semiconductor substrate.

3. A surface acoustic wave device of claim 1 or 2 wherein each edge of said metal electrode confronting a propagating acoustical wave is configured with an irregular profile so as to attenuate said wave.

* * * * *